United States Patent
Hsu et al.

(10) Patent No.: US 11,770,151 B2
(45) Date of Patent: Sep. 26, 2023

(54) SIGNAL RECEIVER AND SIGNAL TRANSCEIVER

(71) Applicant: ALi Corporation, Hsinchu (TW)

(72) Inventors: Chen Hsu, Taipei (TW); Ming-Ta Lee, Taipei (TW)

(73) Assignee: ALI CORPORATION, Hsinchu (TW)

( * ) Notice: Subject to any disclaimer, the term of this patent is extended or adjusted under 35 U.S.C. 154(b) by 4 days.

(21) Appl. No.: 17/531,810

(22) Filed: Nov. 22, 2021

(65) Prior Publication Data

US 2022/0166457 A1    May 26, 2022

(30) Foreign Application Priority Data

Nov. 25, 2020   (CN) .......................... 202011335832.0

(51) Int. Cl.
*H03K 19/0185* (2006.01)
*H03K 19/20* (2006.01)
*H04B 1/40* (2015.01)
*H04L 25/02* (2006.01)
*H04B 1/16* (2006.01)

(52) U.S. Cl.
CPC ........... *H04B 1/40* (2013.01); *H03K 19/0185* (2013.01); *H03K 19/20* (2013.01); *H04B 1/16* (2013.01); *H04L 25/028* (2013.01); *H04L 25/0292* (2013.01)

(58) Field of Classification Search
CPC ........ H04L 25/028; H04B 1/16; H03K 19/20; H03K 19/0185
See application file for complete search history.

(56) References Cited

U.S. PATENT DOCUMENTS

2019/0123777 A1*  4/2019  Kain .................... H03K 5/24
2020/0366276 A1* 11/2020  Shinoda ......... H03K 19/018521

FOREIGN PATENT DOCUMENTS

CN           105322940          2/2016

* cited by examiner

*Primary Examiner* — Patrick C Chen
(74) *Attorney, Agent, or Firm* — JCIPRNET

(57) ABSTRACT

A signal receiver and a signal transceiver are provided, which may avoid unnecessary leakage current. The signal receiver includes a termination switch pair, a first resistor, a second resistor, and a pull-down circuit. The termination switch pair receives an operation power supply. The termination switch pair has a common control end. The first resistor is coupled between a first signal input end and the common control end. The second resistor is coupled between a second signal input end and the common control end. The pull-down circuit is coupled between the common control end and a reference voltage end. The pull-down circuit determines whether to pull down a first control voltage on the common control end to a reference voltage according to a power-on state or a power-off state of the signal receiver.

9 Claims, 4 Drawing Sheets

SIGNAL RECEIVER AND SIGNAL TRANSCEIVER

CROSS-REFERENCE TO RELATED APPLICATION

This application claims the priority benefit of China application serial no. 202011335832.0, filed on Nov. 25, 2020. The entirety of the above-mentioned patent application is hereby incorporated by reference herein and made a part of this specification.

BACKGROUND

1. Technical Field

The disclosure relates to a signal receiver, and more particularly relates to a signal receiver and a signal transceiver, which may avoid generating unnecessary leakage current.

2. Description of Related Art

In common knowledge, in a signal transceiver, when the power supply of the signal receiver is turned off to not perform actions, and a signal transmitter is still in the working state, an undesired conduction path may be generated between the connection path of the signal receiver and the signal transmitter, which leads to the occurrence of leakage current. It is worth noting that the phenomenon of leakage current causes unnecessary power consumption, and may also cause damage to circuit components in an electronic device.

SUMMARY

The disclosure is directed to a signal receiver and a signal transceiver, which may avoid generating unnecessary leakage current.

According to an embodiment of the disclosure, a signal receiver includes a termination switch pair, a first resistor, a second resistor, and a pull-down circuit. The termination switch pair receives an operation power supply. The termination switch pair has a common control end. The first resistor is coupled between a first signal input end and the common control end. The second resistor is coupled between a second signal input end and the common control end. The pull-down circuit is coupled between the common control end and a reference voltage end. The pull-down circuit determines whether to pull down a first control voltage on the common control end to a reference voltage according to the power-on state or the power-off state of the signal receiver.

According to an embodiment of the disclosure, the signal transceiver includes a signal transmitter and a signal receiver. The signal receiver includes a termination switch pair, a first resistor, a second resistor, and a pull-down circuit. The termination switch pair receives an operation power supply. The termination switch pair has a common control end. The first resistor is coupled between a first signal input end and the common control end. The second resistor is coupled between a second signal input end and the common control end. The pull-down circuit is coupled between the common control end and a reference voltage end. The pull-down circuit determines whether to pull down a first control voltage on the common control end to a reference voltage according to the power-on state or the power-off state of the signal receiver. The signal receiver is coupled to the signal transmitter through the first signal input end and the second signal input end.

According to the above description, the signal receiver of the disclosure determines whether to pull down the first control voltage on the common control end to the reference voltage according to the power-on state or the power-off state of the signal receiver, which may avoid generating unnecessary leakage current.

DESCRIPTION OF THE EMBODIMENTS

Figure 1:
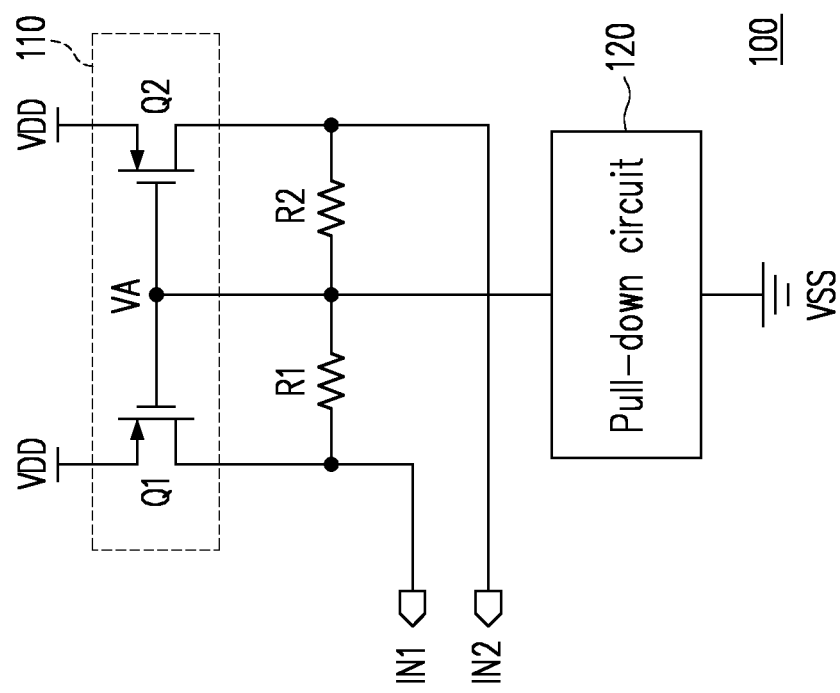
FIG. 1 shows a schematic diagram of a signal receiver according to an embodiment of the disclosure.

Reference will now be made in detail to the exemplary embodiments of the disclosure, examples of which are illustrated in the accompanying drawings. Wherever possible, the same reference numerals are used in the drawings and the description to refer to the same or similar parts.

Please refer to FIG. 1, FIG. 1 shows a schematic diagram of a signal receiver according to an embodiment of the disclosure. A signal receiver 100 includes a termination switch pair 110, a resistor R1, a resistor R2, and a pull-down circuit 120. The termination switch pair 110 is coupled to an operation power supply VDD, and the termination switch pair has a common control end (the endpoint providing a first control voltage VA). The resistor R1 is coupled between a first signal input end IN1 and the common control end. The resistor R2 is coupled between a second signal input end IN2 and the common control end. The pull-down circuit 120 is coupled between the common control end and a reference voltage end (the endpoint providing a reference voltage VSS). In addition, the pull-down circuit 120 determines whether to pull down the first control voltage VA on the common control end to the reference voltage VSS according to the power-on state or the power-off state of the signal receiver 100. For example, the reference voltage VSS may be a ground voltage, but not limited thereto.

In this embodiment, the termination switch pair 110 includes a first transistor Q1 and a second transistor Q2, but not limited thereto. The first transistor Q1 may have a first end receiving the operation power supply VDD. A control end of the first transistor may be coupled to the common control end, and a second end of the first transistor Q1 may be coupled to the resistor R1. The second transistor Q2 may have a first end receiving the operation power supply VDD. A control end of the second transistor Q2 may be coupled to the common control end, and a second end of the second transistor Q2 may be coupled to the resistor R2. For example, the first transistor Q1 or the second transistor Q2 may be a p-type metal-oxide-semiconductor field-effect transistor (MOSFET), but not limited thereto. In this embodiment, the signal receiver 100 may be coupled to a signal transmitter (not shown) through the first signal input end IN1 and the second signal input end IN2.

It should be noted that, in terms of action details, suppose that when the signal transmitter is in the power-on state, when the signal receiver 100 is switched from the power-on state to the power-off state, the pull-down circuit 120 may be turned off due to the power-off state of the signal receiver 100. At this time, the first control voltage VA is dominated by the voltage on the first signal input end IN1 and the second signal input end IN2. On the basis of the signal transmitter being in the power-on state, one of the first signal input end IN1 and the second signal input end IN2 may have a relatively high electrical level, and may be provided to the common control end through the resistor R1 or the resistor R2, so as to pull up the first control voltage VA. Taking the first transistor Q1 and the second transistor Q2 as p-type MOSFETs as an example, the pulled-up first control voltage VA may cause the first transistor Q1 and the second transistor Q2 to be cut off. Therefore, the termination switch pair 110 may be disconnected according to the first control voltage VA on the common control end. It can be known from the above description that although the signal transmitter is in the power-on state, the signal receiver 100 generates no leakage path, and the phenomenon of leakage current does not occur, thereby avoiding unnecessary power consumption and damage to circuit components.

Incidentally, when the signal receiver 100 is in the power-on state, the pull-down circuit 120 is turned on, and the first control voltage VA on the common control end may be pulled down to the reference voltage VSS. On the basis of the first control voltage VA being equal to the reference voltage VSS, the first transistor Q1 and the second transistor Q2 may be conducted. In other words, the termination switch pair 110 may be conducted according to the first control voltage VA on the common control end. Therefore, when the signal transmitter is in the power-on state at the same time, the signal receiver 100 may normally receive the signal sent by the signal transmitter through the first signal input end IN1 and the second signal input end IN2.

Figure 2:
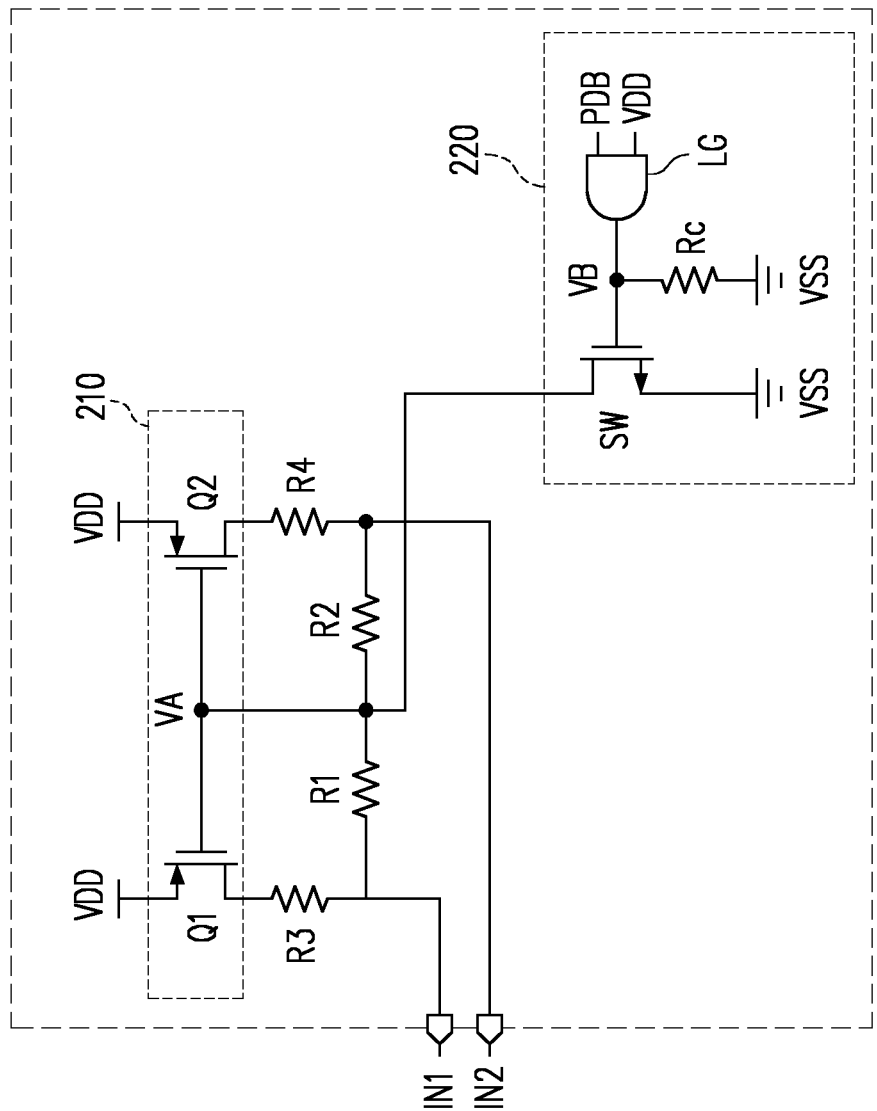
FIG. 2 shows a schematic diagram of an implementation of a signal receiver according to an embodiment of the disclosure.

Please refer to FIG. 2 for the following, FIG. 2 shows a schematic diagram of an implementation of a signal receiver according to an embodiment of the disclosure. A signal receiver 200 may include a termination switch pair 210, a resistor R1, a resistor R2, a resistor R3, a resistor R4, and a pull-down circuit 220.

In this embodiment, the resistor R3 is coupled between the path where the first transistor Q1 is coupled to the resistor R1. The resistor R4 is coupled between the path where the second transistor Q2 is coupled to the resistor R2. For example, the resistor R3 and the resistor R4 may be 50 ohms to achieve the effect of impedance matching and avoid signal reflection, but not limited thereto.

In terms of circuit design, the pull-down circuit 220 may include a switch SW and a logic circuit LG. The switch SW may be coupled between the common control end and the reference voltage end, and the switch SW is controlled by a second control voltage VB. For example, the switch SW may be an n-type MOSFET, but not limited thereto. In addition, the logic circuit LG may be an AND gate, and the logic operation performed by the logic circuit LG is an AND logic operation, but not limited thereto. In this way, the logic circuit LG receives a power-on/off-state signal PDB and the operation power supply VDD. The logic circuit LG performs the logic operation on the power-on/off-state signal PDB and the operation power supply VDD to generate the second control voltage VB.

Specifically, when the signal receiver 200 is in the power-off state, the power-on/off-state signal PDB and the operation power supply VDD are both at low electrical levels. At this time, the logic circuit LG may enable the second control voltage VB to be at a low electrical level, and enable the switch SW to be disconnected through the second control voltage VB at a low electrical level. In other words, the pull-down circuit 220 is turned off due to the power-off state of the signal receiver 200. In addition, the first signal input end IN1 and the second signal input end IN2 may be provided to the common control end respectively through the resistor R1 or the resistor R2, so as to generate the first control voltage VA. It is worth noting that since the signal transmitter is in the power-on state, it means that the first signal input end IN1 and the second signal input end IN2 are at high electrical levels, so that the first control voltage VA may immediately reach a high electrical level. Then, the first transistor Q1 and the second transistor Q2 are cut off according to the first control voltage VA on the common control end, and the termination switch pair 210 may be disconnected. Therefore, although the signal transmitter is in the power-on state, no leakage path is generated, and the phenomenon of leakage current does not occur, thereby avoiding unnecessary power consumption and damage to circuit components.

Moreover, when the signal receiver 200 is in the power-on state, the power-on/off-state signal PDB and the operation power supply VDD are both at high electrical levels. At this time, the logic circuit LG may enable the second control voltage VB to be at a high electrical level, and enable the switch SW to be conducted through the second control voltage VB at a high electrical level. In other words, the pull-down circuit 220 is turned on due to the power-on state of the signal receiver 200. In addition, the pull-down circuit 220 may pull down the first control voltage VA on the common control end to the reference voltage VSS. Taking the first transistor Q1 and the second transistor Q2 as p-type MOSFETs as an example, the pulled-down first control voltage VA may enable the first transistor Q1 and the second transistor Q2 to be conducted. Therefore, the termination switch pair 210 may be conducted according to the first control voltage VA on the common control end. It can be known from the above description that when the signal transmitter 200 is in the power-on state, the signal receiver 200 may normally receive the signal of the signal transmitter through the first signal input end IN1 and the second signal input end IN2.

Furthermore, the pull-down circuit 220 may further include a resistor Rc. The resistor Rc is coupled between a control end (the endpoint providing the second control voltage VB) of the switch SW and the reference voltage end (the endpoint providing the reference voltage VSS). The resistor Rc may be used to prevent the control end of the switch SW from floating.

In this embodiment, in order to avoid affecting an output end of the signal transmitter in the normal mode (the signal receiver 200 and the signal transmitter are both turned on), the resistance values of the resistors R1 and R2 may be relatively greater than the resistance values of the resistors R3 and R4. Taking the resistance values of the resistors R3 and R4 as both 50 ohms as an example, the resistance values of the resistors R1 and R2 may be, for example, 120 kiloohms.

Figure 3:
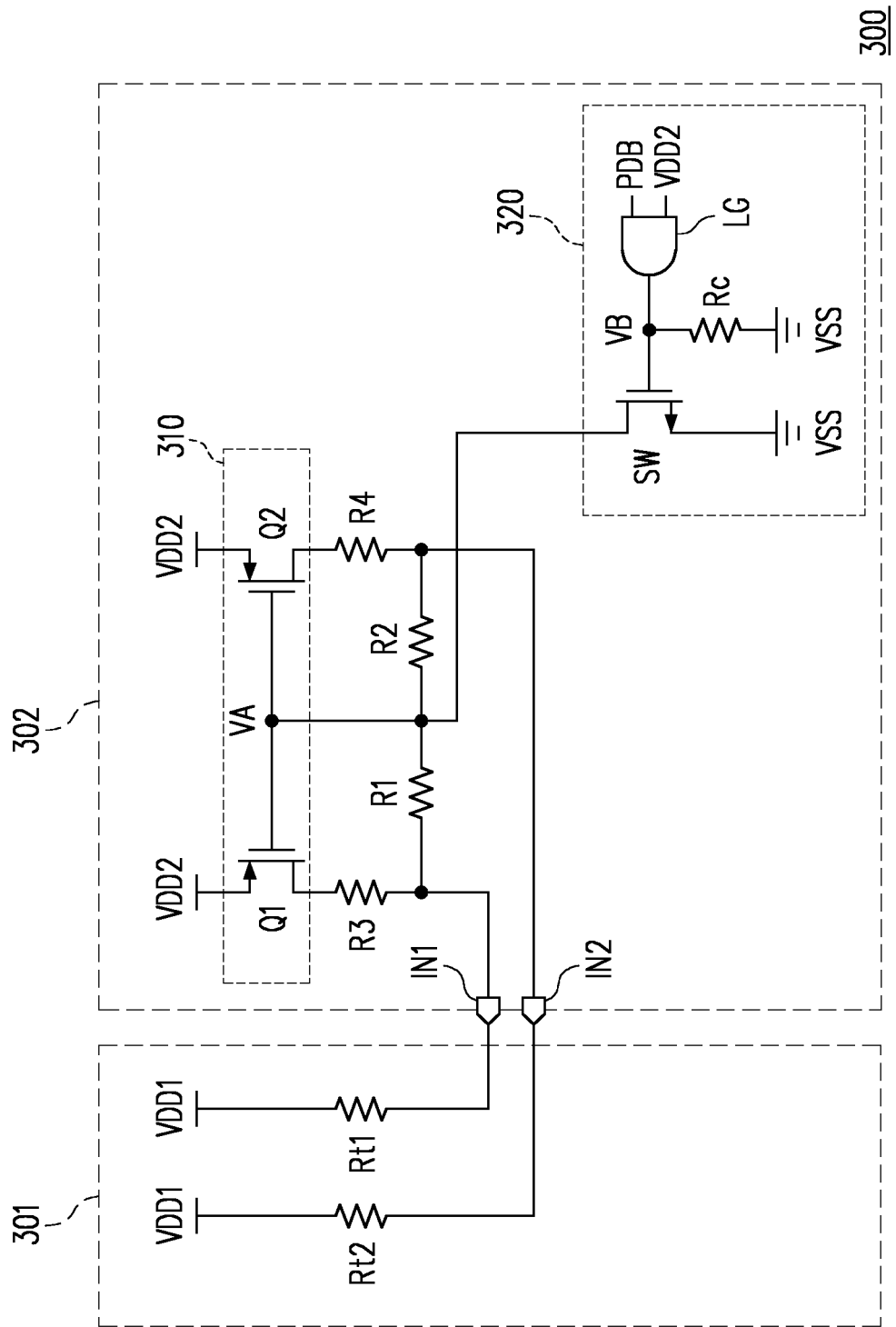
FIG. 3 shows a schematic diagram of a signal transceiver according to an embodiment of the disclosure.

Please refer to FIG. 3 for the following, FIG. 3 shows a schematic diagram of a signal transceiver according to an embodiment of the disclosure. A signal transceiver 300 may include a signal transmitter 301 and a signal receiver 302. Regarding the description of the signal receiver 302, reference may be made to the descriptions of FIG. 1 and FIG. 2, which will not be repeated here. The difference between FIG. 3 and FIG. 2 is that the signal receiver 302 may be coupled to the signal transmitter 301 through the first signal input end IN1 or the second signal input end IN2. It is worth noting that, for convenience of description, the signal transmitter 301 is simplified into a resistor Rt1 and a resistor Rt2. For example, in this embodiment, the first signal input end IN1 or the second signal input end IN2 may be coupled to an operation power supply VDD1 respectively through the resistor Rt1 or the resistor Rt2. In addition, in this embodiment, a termination switch pair 310 of the signal receiver 302 may be coupled to an operation power supply VDD2, and the logic circuit LG may receive the power-on/off-state signal PDB and the operation power supply VDD2 to perform the logic operation, so as to generate the second control voltage VB.

In this embodiment, in terms of action details, suppose that when the signal transmitter 301 is in the power-on state, when the signal receiver 302 is switched from the power-on state to the power-off state, a pull-down circuit 320 may be turned off due to the power-off state of the signal receiver 302. At this time, the first control voltage VA is dominated by the voltage on the first signal input end IN1 and the second signal input end IN2. On the basis of the signal transmitter being in the power-on state, one of the first signal input end IN1 and the second signal input end IN2 may have a relatively high electrical level, and may be provided to the common control end through the resistor R1 or the resistor R2, so as to pull up the first control voltage VA. Taking the first transistor Q1 and the second transistor Q2 as p-type MOSFETs as an example, the pulled-up first control voltage VA may enable the first transistor Q1 and the second transistor Q2 to be cut off. Therefore, the termination switch pair 310 may be disconnected according to the first control voltage VA on the common control end. It can be known from the above description that although the signal transmitter 301 is in the power-on state, no leakage path is generated, and the phenomenon of leakage current does not occur, thereby avoiding unnecessary power consumption and damage to circuit components.

Figure 4:
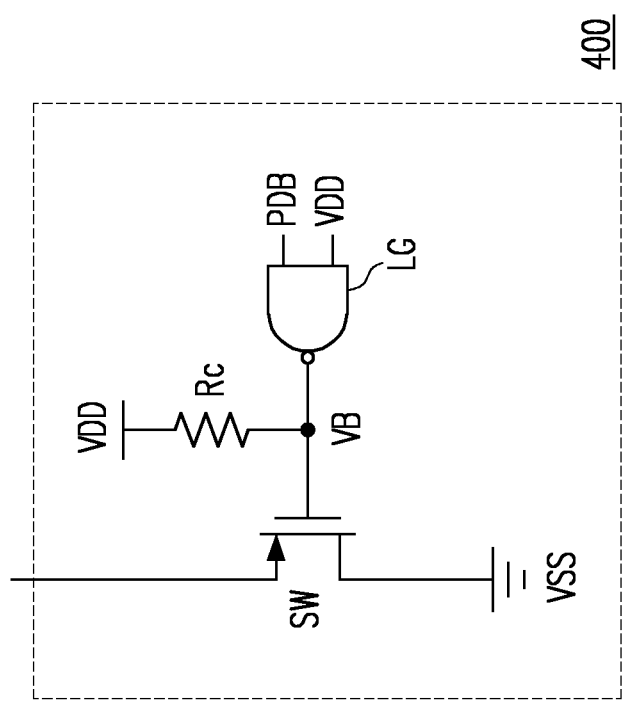
FIG. 4 shows a schematic diagram of an implementation of a pull-down circuit according to an embodiment of the disclosure.

Please refer to FIG. 1 and FIG. 4 for the following, FIG. 4 shows a schematic diagram of an implementation of a pull-down circuit according to an embodiment of the disclosure. A pull-down circuit 400 may include the switch SW and the logic circuit LG. The switch SW may be coupled between the common control end and the reference voltage end, and the switch SW is controlled by the second control voltage VB. In this embodiment, the switch SW may be a p-type MOSFET, but not limited thereto. In addition, the logic circuit LG may be a NAND gate, and the logic operation is a NAND logic operation, but not limited thereto. In this way, the logic circuit LG receives the power-on/off-state signal PDB and the operation power supply VDD. The logic circuit LG performs the logic operation on the power-on/off-state signal PDB and the operation power supply VDD to generate the second control voltage VB.

Specifically, when the signal receiver 100 is in the power-off state, the power-on/off-state signal PDB and the operation power supply VDD are both at low electrical levels. At this time, the logic circuit LG may enable the second control voltage VB to be at a high electrical level, and enable the switch SW to be disconnected through the second control voltage VB at a high electrical level. In addition, the first signal input end IN1 and the second signal input end IN2 may be provided to the common control end respectively through the resistor R1 or the resistor R2, so as to generate the first control voltage VA. Then, the first transistor Q1 and the second transistor Q2 are cut off according to the first control voltage VA on the common control end, and the termination switch pair 110 may be disconnected. Therefore, although the signal transmitter is in the power-on state, no leakage path is generated, and the phenomenon of leakage current does not occur, thereby avoiding unnecessary power consumption and damage to circuit components.

Moreover, when the signal receiver 100 is in the power-on state, the power-on/off-state signal PDB and the operation power supply VDD are both at high electrical levels. At this time, the logic circuit LG may enable the second control voltage VB to be at a low electrical level, and enable the switch SW to be conducted through the second control voltage VB at a low electrical level. In other words, the pull-down circuit 400 is turned on due to the power-on state of the signal receiver 100. In addition, the pull-down circuit 400 may pull down the first control voltage VA on the common control end to the reference voltage VSS. Taking the first transistor Q1 and the second transistor Q2 as p-type MOSFETs as an example, the pulled-down first control voltage VA may enable the first transistor Q1 and the second transistor Q2 to be conducted. Therefore, the termination switch pair 110 may be conducted according to the first control voltage VA on the common control end. It can be known from the above description that when the signal transmitter is in the power-on state, the signal receiver 100 may normally receive the signal of the signal transmitter through the first signal input end IN1 and the second signal input end IN2.

Furthermore, the pull-down circuit 400 may further include the resistor Rc. The resistor Rc is coupled between the control end (the endpoint providing the second control voltage VB) of the switch SW and the operation power supply end (the endpoint providing the operation power supply VDD). The resistor Rc may be used to prevent the control end of the switch SW from floating.

According to the above description, in the signal receiver and the signal transceiver of the disclosure, when the signal transmitter is in the power-on state, the pull-down circuit of the signal receiver determines whether to pull down the first control voltage on the common control end to the reference voltage according to the power-on state or the power-off state of the signal receiver. In this way, when the signal transmitter is in the power-on state, the signal receiver generates no leakage path, and the phenomenon of leakage current does not occur, thereby avoiding unnecessary power consumption and damage to circuit components.

Finally, it should be noted that the above embodiments are only used to illustrate, but not to limit, the technical solutions of the disclosure. Although the disclosure has been described in detail with reference to the above embodiments, persons skilled in the art should understand that they may still modify the technical solutions described in the above embodiments, or equivalently replace some or all of the technical features. Such modifications or replacements do not cause the essence of the corresponding technical solutions to deviate from the scope of the technical solutions according to the embodiments of the disclosure.

What is claimed is:

1. A signal receiver, comprising:
   a termination switch pair, receiving an operation power supply and having a common control end, wherein the termination switch pair comprises two transistors, and the common control end is coupled to a control end of each of the two transistors;
   a first resistor, coupled between a first signal input end and the common control end;

a second resistor, coupled between a second signal input end and the common control end; and a pull-down circuit, coupled between the common control end and a reference voltage end, and determining whether to pull down a first control voltage on the common control end to a reference voltage according to a power-on state or a power-off state of the signal receiver, wherein when the signal receiver is in the power-off state, a voltage on the first signal input end or the second signal input end is provided to the common control end through the first resistor or the second resistor, and the termination switch pair is disconnected according to the first control voltage on the common control end.

2. The signal receiver according to claim 1, wherein when the signal receiver is in the power-on state, the pull-down circuit pulls down the first control voltage on the common control end to the reference voltage.

3. The signal receiver according to claim 1, wherein the termination switch pair comprises:

a first transistor, having a first end receiving the operation power supply, a control end of the first transistor being coupled to the common control end, and a second end of the first transistor being coupled to the first resistor; and a second transistor, having a first end receiving the operation power supply, a control end of the second transistor being coupled to the common control end, and a second end of the second transistor being coupled to the second resistor.

4. The signal receiver according to claim 3, further comprising:

a third resistor, coupled between a path where the first transistor is coupled to the first resistor; and a fourth resistor, coupled between a path where the second transistor is coupled to the second resistor.

5. The signal receiver according to claim 1, wherein the pull-down circuit comprises:

a switch, coupled between the common control end and the reference voltage end, and controlled by a second control voltage; and a logic circuit, receiving a power-on/off-state signal and the operation power supply, and performing a logic operation on the power-on/off-state signal and the operation power supply to generate the second control voltage.

6. The signal receiver according to claim 5, wherein the pull-down circuit further comprises:

a third resistor, coupled between a control end of the switch and the reference voltage end.

7. The signal receiver according to claim 5, wherein the logic operation is an AND logic operation.

8. The signal receiver according to claim 1, wherein the reference voltage is a ground voltage.

9. A signal transceiver, comprising:

a signal transmitter; and the signal receiver according to claim 1, wherein the signal receiver is coupled to the signal transmitter through the first signal input end and the second signal input end.

* * * * *